United States Patent [19]

Eichenlaub et al.

[11] 4,156,929
[45] May 29, 1979

[54] DIGITAL MONITORING SYSTEM

[75] Inventors: Dennis P. Eichenlaub, Baltimore; Donald P. Garrett, Towson, both of Md.

[73] Assignee: Westinghouse Electric Corp., Pittsburgh, Pa.

[21] Appl. No.: 740,323

[22] Filed: Nov. 9, 1976

[51] Int. Cl.² ............................................. G06F 11/08
[52] U.S. Cl. ................................ 364/900; 235/303.4; 235/307
[58] Field of Search ......................... 364/900 MS File; 235/153 AE, 153 AK, 303.4, 307; 340/146.1 BE

[56] References Cited

U.S. PATENT DOCUMENTS

| 3,770,948 | 11/1973 | Caputo et al. | 235/153 AE |
|---|---|---|---|
| 3,895,223 | 7/1975 | Neuner et al. | 235/153 AE |

Primary Examiner—Raulfe B. Zache

Attorney, Agent, or Firm—M. P. Lynch

[57] ABSTRACT

Each of a plurality of data modules employing commercially available microprocessor circuitry, process pulse rate information from a plurality of remote monitors to develop a digital indication of a desired parameter, i.e., radiation level. A digital check module, incorporating microprocessor electronics comparable to that of the data module, scans the respective data modules to determine the operational integrity of the data modules and automatically assumes the operational responsibility of a data module determined to be operating improperly.

While the radiation level is proportional to the rate of the pulses developed by the radiation monitor the instantaneous pulse rate is random. The data modules and check module are digitally designed, incorporating commercially available micro-computers, to determine the true average rate of random pulses or events and to automatically optimize the trade-off between statistical error and system response time.

10 Claims, 12 Drawing Figures

DIGITAL MONITORING SYSTEM

CROSS-REFERENCE TO RELATED APPLICATIONS

This application is related to the following pending applications, filed Nov. 9, 1976 and assigned to the assignee of the present invention:

| Inventors | Serial No. | Title |
| --- | --- | --- |
| (1) D. P. Eichenlaub | 740,321 | True Mean Rate Measuring System |
| (2) D. P. Eichenlaub | 740,322 | Count Logic Circuit |

BACKGROUND OF THE INVENTION

There are many requirements for the measurement of ionizing radiation. For example, nuclear power plants require measurements of radiation fields, radioactive isotope concentrations, etc.

Conventional analog radiation monitoring systems consist of a plurality of signal channels each consisting of a discrete remote radiation monitor and an analog circuit for converting the pulse output of the radiation monitor into an analog signal indicative of the radiation level. The output signal developed by the analog circuit is a voltage which is proportional to the log of the average frequency of the pulses developed by the remote radiation monitor. Typically this voltage output is utilized to drive a visual display or actuate an alarm. The analog format of the radiation information of conventional analog radiation systems is not suitable for rapid complex analysis.

Further, the nuclear decays typically encountered result in a random frequency of pulses from the radiation detectors and the inherent nature of the analog circuit is such that it is extremely difficult to design a radiation monitoring system which exhibits both a low statistical error and a response time sufficiently fast to detect changes. This is due to the fact that a low statistical error requires averaging over a very long period of time which in turn implies a very slow response time for the analog radiation monitoring system.

Prior art analog systems inherently average for a fixed time. Thus, the design includes a fixed trade-off between statistical error and response time.

SUMMARY OF THE INVENTION

There is disclosed herein with reference to the accompanying drawings a digital radiation monitoring system employing state-of-the-art digital and microprocessor circuitry for rapidly processing pulse information from remote radiation monitors by analyzing pulse rates to determine whether new pulse rate information is statistically the same as previously received pulse rate information and in so doing determine the best possible averaging time for the system. As long as the true mean pulse rate remains constant, the averaging time is permitted to increase until the statistical error is below a desired level, i.e., 1%. When the digital processing of the pulse information indicates a change in the true mean pulse rate, the averaging time can be reduced to improve the system response time at the expense of statistical error.

The digital radiation monitoring system consists basically of a plurality of data modules each responsible for processing the pulse rate information from a plurality of remote radiation monitors. Each data module accepts pulse information from each of a plurality of radiation monitors and measures the true average or mean pulse rate of events occurring with a Poisson distribution to determine the radiation level associated with the respective radiation monitors in accordance with the process described above. Each data module in turn develops digital output signals indicative of the respective radiation level. These signals are available for alarm and control purposes. The digital output signals are also available for transmission via a multiplexer circuit for additional processing and display purposes. The data modules are designed to accept communications from a remote control station or computer station via the multiplexer circuit to change operating thresholds and alarm levels in the memory of the data module.

In addition to the plurality of data modules, there is included a check module, which consists of electronics comparable to that of the data module. The check module functions to scan the various data modules to determine whether the output signals developed by the data modules represent valid information. The check module further functions as a redundant data module to automatically take the place of an inoperative data module to avoid loss of potentially critical alarm conditions reflected by the radiation detectors associated with a faulty data module.

DESCRIPTION OF THE DRAWINGS

The invention will become more readily apparent from the following exemplary description in connection with the accompanying drawings.

DESCRIPTION OF THE PREFERRED EMBODIMENT

Figure 1:
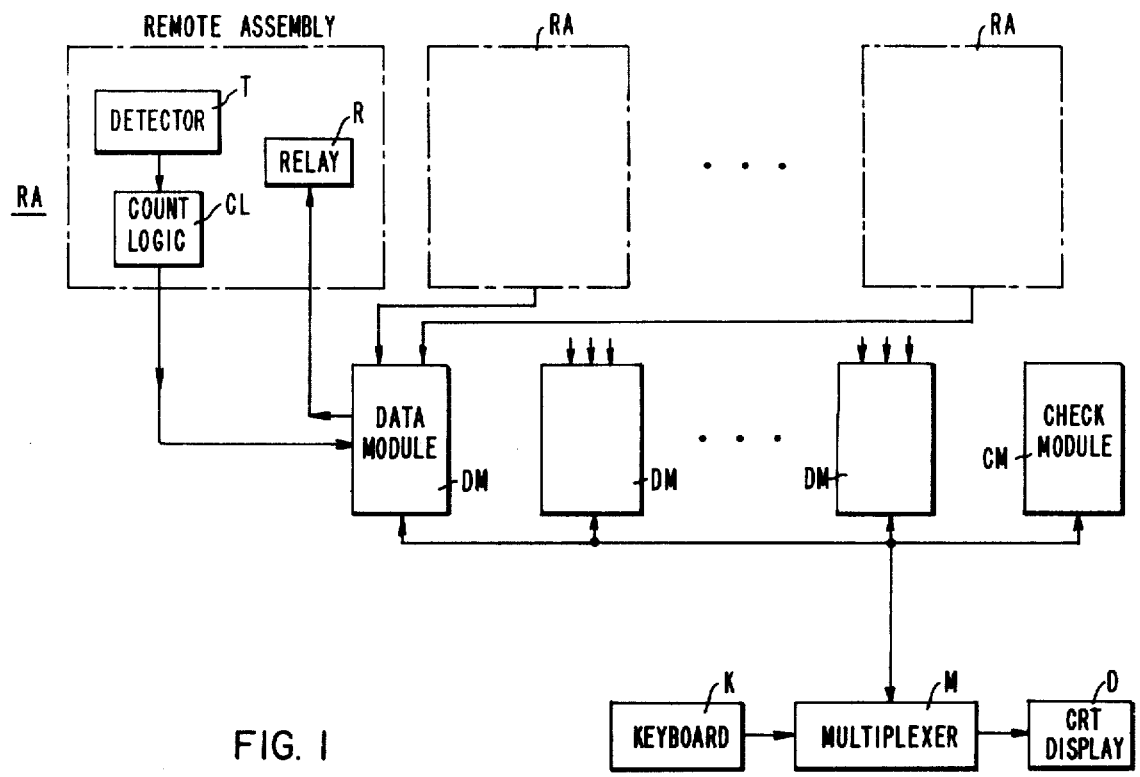
FIG. 1 is a block diagram illustration of an embodiment of a digital radiation monitoring system.

Referring to FIG. 1 there is schematically illustrated a digital radiation monitoring system 10 including a plurality of data modules DM and a check module CM operatively coupling the remote radiation field information derived by the remote assemblies RA via a multiplexer M to various control and readout circuits represented by the CRT display D and the keyboard K. The function of the multiplexer circuit M, which is to provide a communications link, can be routinely implemented.

In the embodiment illustrated, the basic digital circuitry employed in each of the data modules DM and the check module CM consists of a buffer, a relay control logic circuit and a micro-computer circuit, which employs a commercially available microprocessor circuit such as the Intel 8080. Inasmuch as the micro-computer circuit selected for implementing the preferred embodiment of the invention is typically capable of processing up to eight inputs, each data module is designated to accommodate pulse input information from eight remote assemblies RA. Each bank of eight data modules DM of the digital radiation monitoring system 10 is operationally combined with a check module CM. Obviously, the number of data modules and check modules employed is a design choice. Each remote assembly RA is illustrated as including a radiation monitor, or detector, T, count logic CL and a relay R. The radiation monitor T transmits pulses, indicative of a radiation level to which it is exposed, to the count logic CL which transmits the measurement to the data module DM for processing.

A major function of the count logic CL of the remote assembly RA is to measure the number of events or pulses per unit of time. Since the measured radiation can vary by as much as eight decades the count logic CL must function over an extremely wide dynamic range. Furthermore, to make statistical tests as simple as possible, as described hereafter, the count logic CL is designed to measure the time between an integer power of a preset number of events, i.e., four. A typical implementation of the count logic CL is described below with reference to FIG. 7A.

The data module DM transmits a digital representation of the respective radiation level via the multiplexer circuit M to the various control and display circuits, and further compares the incoming pulse rate information from the respective remote assemblies to a predetermined threshhold, or alarm level, and transmits a trip signal to relay R of the remote assembly RA. Typically the relay R is utilized to execute a control function at the remote location in response to an alarm condition. Clearly the number of relays and output functions is a design choice.

In order to achieve the desired operational characteristics of high accuracy and fast response in the difficult random event environment corresponding to the pulse outputs from the radiation monitors T, the micro-computer is designed to average the frequency of the pulse information with six different time constants and via statistical analysis a decision is made as to which time constant is employed. The operation of the micro-computer circuit in each of the data modules DM is designed to rely primarily on addition, subtraction and shift operations to achieve an optimal trade-off between system accuracy and system response time while exhibiting an execution time sufficiently fast to accommodate the processing of pulse information from eight remote assemblies RA in real time.

The check module CM, which includes a micro-computer circuit comparable to that of the data modules DM, functions in one of two modes. In a first mode, the check module CM selects a data module DM, monitors its inputs from the remote assemblies and compares the data modules output signals to output signals developed by the check module CM. Substantial coincidence between the two sets of output signals indicate an acceptable operational status for the data module DM and the check module selects another data module to monitor.

In the second mode of operation, the check module stops its scanning of the data modules if a data module is determined to be inoperative and the check module CM assumes the operational responsibility of the inoperative data module DM.

The digital information transmitted via the data modules DM through the multiplexer M can also be made available to a computer (not shown). The computer can be employed to perform complex analysis and projections from the digital data of the data modules DM. Additional control information could be developed by such a computer and supplied via the multiplexer circuit M to the memory of the micro-computer of the data modules DM.

Figure 2:
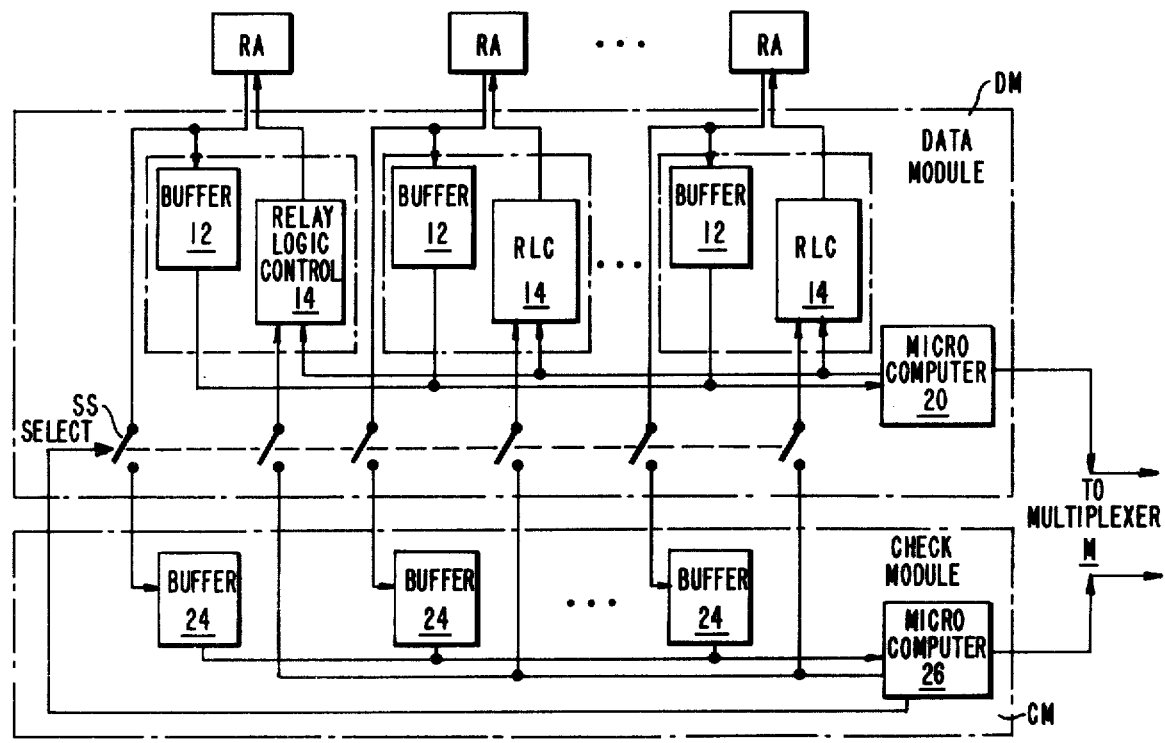
FIG. 2 is a block diagram illustration of a data module and check module of the embodiment of FIG. 1.

Referring to FIG. 2, there is schematically illustrated the operational connection between a data module DM and check module CM. The data module DM is illustrated as consisting of eight interface circuits 11 and one micro-computer circuit 20. Each interface circuit 11 consists of a buffer circuit 12 and a relay logic control circuit 14 and functions to process the pulse information from the count logic CL of a remote assembly RA. The check module correspondingly includes buffer circuits 24 for selective coupling via switch SS to the eight interface circuits 11 of a selected data module DM. The buffer circuit 24 of the check module CM is connected to a micro-computer circuit 26 which is substantially identical to the micro-computer circuit 20.

The buffer circuit 12 of the interface circuit 11 accepts as input signals the pulse rate information from the count logic CL of the remote assembly RA and converts the pulse rate information to signal levels compatible with the micro-computer circuit 20.

The micro-computer circuit 20, which for the purpose of discussion includes a commercially available Intel 8080 microprocessor circuit, accepts signals from the buffer 12 and calculates an estimate of the true mean radiation level associated with a monitor T and further determines the statistical error of the estimate. Further, the micro-computer circuit 20 compares the calculated radiation level to a predetermined threshold, or alarm level, and generates a relay trip signal if the calculated radiation level exceeds the predetermined threshold. The relay trip signal is then available to activate the remote assembly relay R via the relay logic control circuit 14.

The micro-computer circuit 20 also monitors its own operational status and generates an equipment failure signal in response to faulty operation. Both the relay trip signal and the equipment failure signal of the data module are supplied to the relay logic control circuit 14.

The relay logic control circuit 14 also receives as inputs the relay trip signal and equipment failure signal developed by the micro-computer circuit 26 of the check module which corresponds operationally to the micro-computer circuit 20. The relay logic control circuit 14 of FIG. 5A interrogates the signals from the data module DM and the check module CM and transmits a signal to the relay R.

The multiplexer circuit M accepts the radiation level signals, the relay trip signals and the equipment failure signals from the data modules DM and the check module CM, displays the information on the CRT display D and transmits operator response in terms of signals from the keyboard K to the micro-computer circuits.

Figure 3:
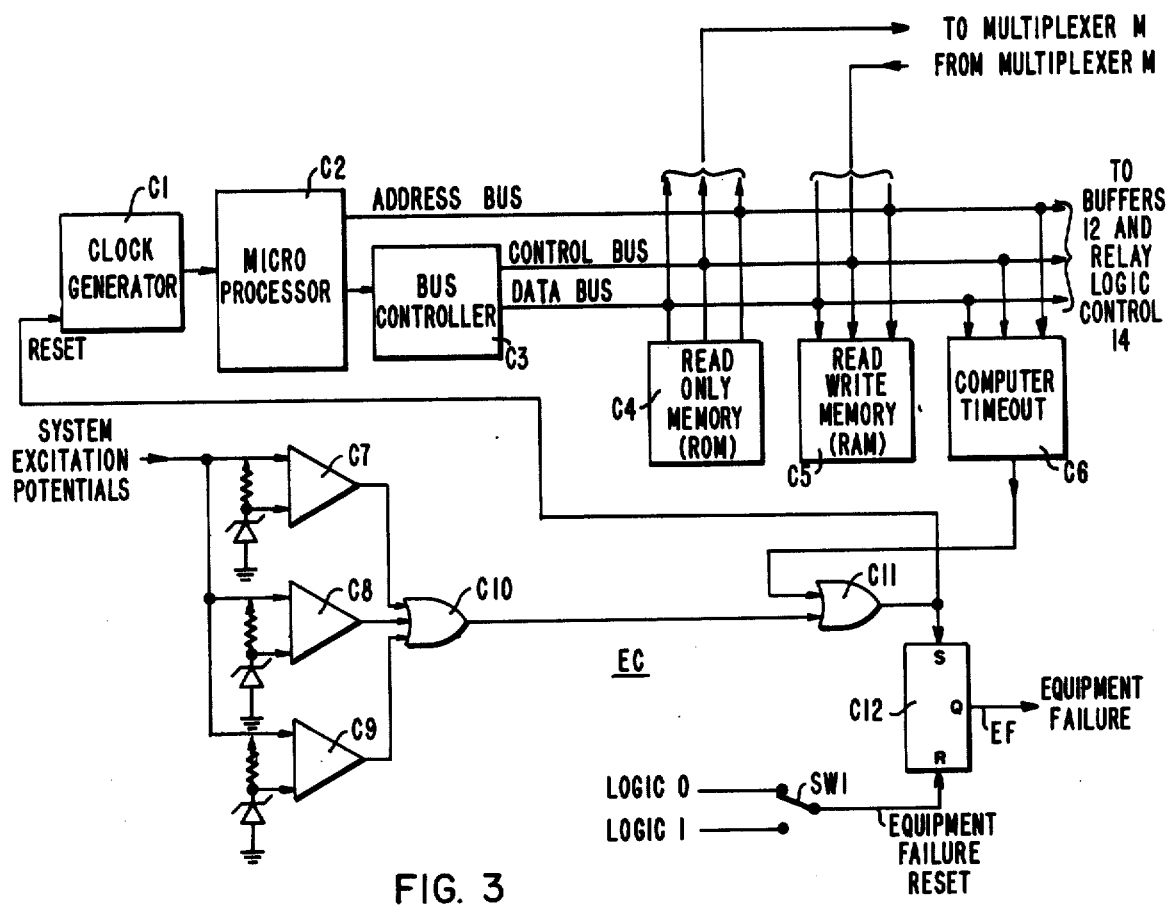
FIG. 3 is a schematic illustration of the micro-computer and equipment failure circuitry of the data module and check module of FIG. 2.

The generation of the equipment failure signal as well as the overall operation of the micro-computer circuit 20 the data module which, as indicated above, is comparable to that of the check module, and is described herein with reference to the block diagram illustration of FIG. 3. The micro-computer circuit 20 consist basically of well known commercially available components which, for the purposes of discussion, have been identified by model numbers associated with commercially available circuits from Intel. The micro-computer circuit consists of a clock generator C1 (Intel 8224), a microprocessor circuit C2 (Intel 8080), a bus controller C3 (Intel 8228), read only memory C4 (ROM), a read/write memory C5 (RAM), a computer time out circuit C6 and the equipment failure circuit EC consisting of bistable comparator circuits C7, C8 and C9, OR gates C10 and C11, and latch circuit C12. The micro-computer circuit 20 is converted from a general purpose computer circuit to a dedicated radiation monitoring circuit via the algorithm or program designed to satisfy the function of the micro-computer circuit in the radiation monitoring system 10. This program is stored in the read only memory C4. The microprocessor circuit C2 functions to measure the pulse rate of events transmitted from the remote assemblies RA via the buffer circuits 12 of the data modules through the use of averaging routines of the read only memory C4. The micro-computer circuit provides radiation level information for remote display and control via multiplexer M, as well as comparing the calculated radiation levels to a predetermined level established in the read/write memory C5. This predetermined level information is inserted by the operator keyboard K. The bus controller C3 generates signals for the control bus, i.e., memory read, memory write, etc., and provides an interface between the data bus and the micro-processor circuit C2.

The specific program, or algorithm, stored in the read only memory C4 is designed to satisfy the radiation monitoring system 10 requirement for determining the true mean pulse rate of random events occurring with a Poisson distribution. The functional operation of the micro-computer circuit 20 in response to the routines comprising the program stored in the read only memory C4 are described below in reference to the flow chart of FIG. 6 and the corresponding equivalent hardware implementation of FIG. 7B. The equipment failure signal EF is a function of the computer time out circuit C6 and the bistable comparator circuits C7, C8 and C9. The number of bistable comparator circuits is determined by the number of different operational voltage levels in the system. Assuming three distinct operational voltage supply levels for the radiation monitoring system 10, each of the bistable comparators is responsive to one of the supply voltage levels and develops a logic level in response to the absence or failure of the respective supply voltage. A failure of any voltage produces a logic 1 output from the OR gate C10 which is supplied as an input to the OR gate C11. A second input to the OR gate C11 is supplied by a computer timeout circuit C6. The presence of a logic 1 output from OR gate C10 or a logic 1 at the output of the computer timeout circuit C6 causes OR gate C11 to set the latch circuit C12 and reset the micro-computer circuit 20 via the reset input of the clock generator C1. The set condition of the latch circuit C12 produces an equipment failure output signal EF. Once activated, the latch circuit C12 can be reset and signal EF terminated by supplying a logic 1 to the reset of latch circuit C12. This reset can be typically accomplished by switch SW1.

Figure 4:
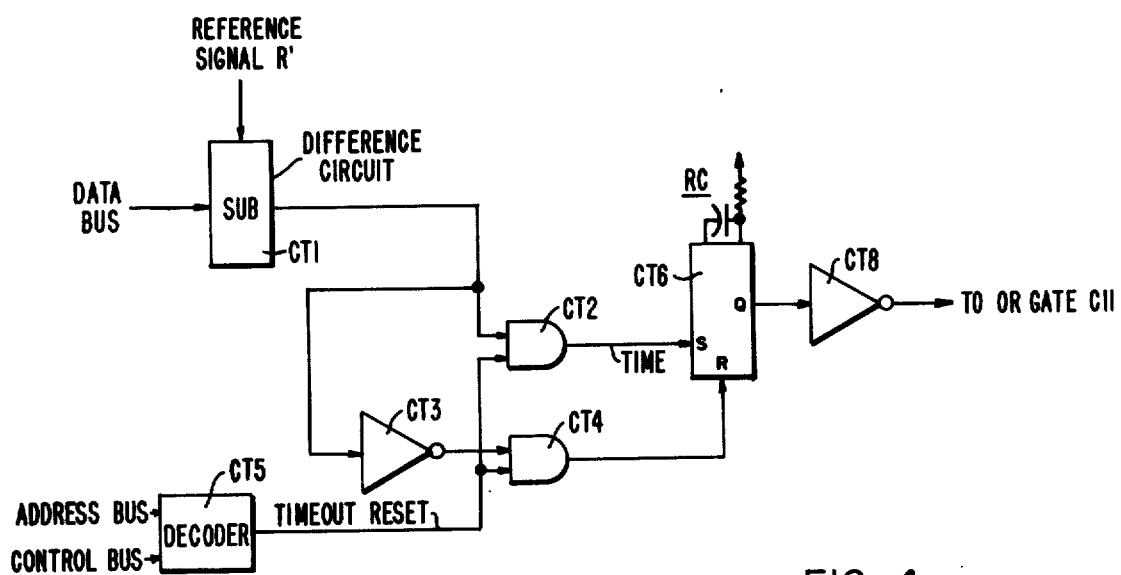
FIG. 4 is a schematic illustration of the computer time out circuit of FIG. 3.

A typical implementation of the computer time out circuit C6 is schematically illustrated in FIG. 4. The decoder circuit CT5 interrogates address and control bus conditions to activate a timeout reset function which enables the circuit to accept information from the micro-computer circuit via the data bus input to the difference circuit CT1.

During a timeout reset, computer status information presented on the data bus is supplied as an input to the difference circuit CT1 which functions to compare the information on the data bus to a predetermined reference R'. If the computer status information corresponds to the predetermined reference R when the timeout reset function is activated, the output from the difference circuit CT1 and the timeout reset logic signal from the decoder circuit CT5 causes the AND gate CT2 to develop a logic 1 output which is supplied as a time input to the one shot circuit CT6. This results in a logic 1 output from the one shot circuit CT6 which is maintained for the timeout period determined by the resistor-capacitor circuit RC. In the event the computer staatus information of the data bus supplied as an input to the difference circuit CT1 does not correspond to the predetermined reference R', a logic 0 output is developed by the difference circuit CT1 which is inverted to a logic 1 level by the inverter circuit CT3 and is supplied as an input to the AND gate CT4. This logic 1 in coincidence with a logic 1 level for the time out reset signal from the decoder circuit CT5 results in a logic 1 output from the AND gate CT4 which is supplied as a reset signal to the one shot circuit CT6. The reset signal results in a logic 0 output from the one shot circuit CT6. A logic 0 output from the one shot circuit CT6 passes through inverter CT8 and corresponds to the logic level from the computer time out circuit C6 of FIG. 4 which is supplied as an input to the OR gate C11 of the equipment failure logic circuit of FIG. 3. As long as a logic 1 is maintained at the output of the one shot circuit CT6 by a time input from the AND gate CT2, no equipment failure signal EF will be generated by the latch circuit C12 of the equipment failure logic circuit EC of FIG. 3.

The timeout time for the one shot circuit CT6 are a matter of design choice. However, a typical time suitable for implementing the above operation would be 100 milliseconds. The selection of this time results in the development of an equipment failure signal EF if the micro-computer does not successfully update the computer timeout circuit C6 with information equal to the reference R' every 100 milliseconds.

The computer time out circuit C6 provides detection for most micro-computer circuit failures since most failures will result in catastrophic failure, and the timeout will not be successfully reset. Circuit C6 can further be used to detect numerous micro-computer failures as described below.

The equipment failure function described above is associated with each of the data modules and check module such that each module is capable of developing an output signal indicative of equipment failure of the respective module. The transmission of the equipment failure signals to the multiplexer circuit M and the relay logic control circuits 14 provide the basis for determining the operational integrity of the respective module. In the event a data module DM indicates equipment failure, the check module CM is then operationally substituted for the data module so as to prevent loss of the radiation level information and subsequent alarm and control functions associated with the defective data module.

Figure 5:
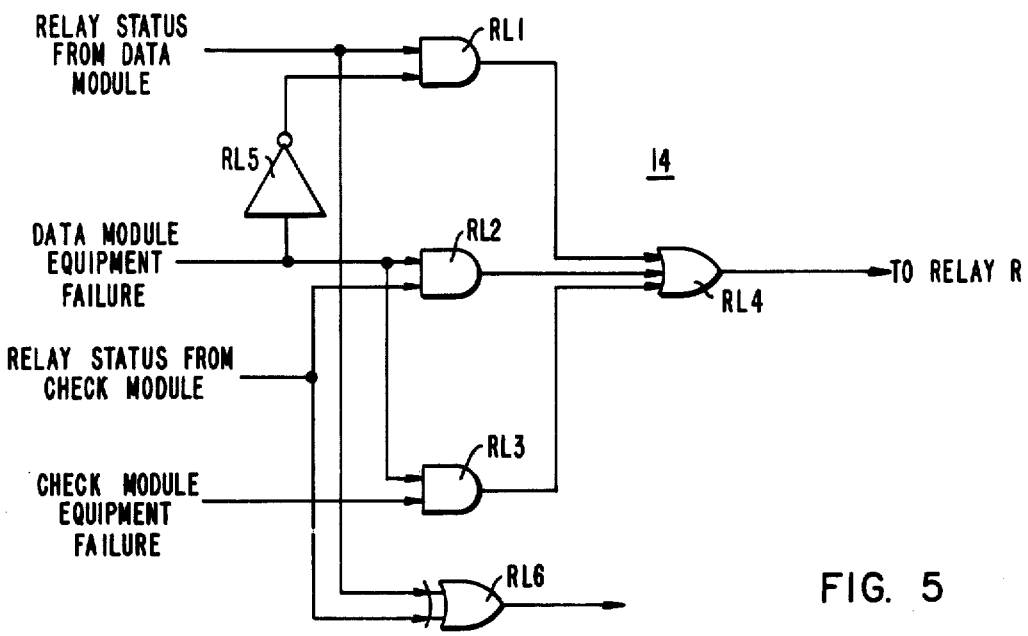
FIG. 5 is a schematic illustration of the relay logic control circuit of FIG. 2.

Referring to FIG. 5 there is schematically illustrated an implementation of the relay logic control circuit 14 which functions to determine whether the data module or the check module outputs are to be transmitted to the relay R of the remote assembly RA. A similar circuit is suitable for use in the multiplexer M to control the information supplied to the CRT display D. The relay logic control circuit 14 operates such that the absence of an equipment failure signal EF from a data module, the output signals from the data module will be processed by the relay logic control circuit 14 to control the relay R. If, however, an equipment failure signal EF is present from the data module DM, the output signals from the check module CM will be selected by the relay logic control circuit 14 to control the relay R.

A logic 1 level at the output of any of the AND gates RL1, RL2 or RL3 will be transmitted via OR gate RL4 to energize the relay R of the respective remote assembly RA. The input signals to AND gate RL1 consist of a relay status indication from the data module and a signal transmitted via inverter gate RL5 indicative of the status of the equipment failure logic circuit EC of the data module. The presence of a logic 1 level indicating an "ON" relay status of the data module in combination with the absence of an equipment failure signal which is representative as a logic 0 input to the inverter RL5 and a corresponding logic 1 second input to the AND gate RL1 will produce a condition developing a logic 1 output from AND gate RL1 suitable for energizing relay R. A second set of conditions, corresponding to the inputs of the AND gate RL2, suitable for energizing relay R consist of the simultaneous occurrence of an "ON" status of the check module and the absence of an equipment failure signal EF from the check module. The third set of conditions, which, if present, will produce a logic 1 output from the AND gate RL3 suitable for energizing relay R consist of the simultaneous occurrence of logic 1 equipment failure signals EF from both the data module and the check module. This last set of conditions, corresponds to the situation where the operational status of both the check module and the data module is deemed to be unacceptable and the energizing of relay R provides a "failsafe" mode of operation. The EXCLUSIVE OR gate RL6 has as its inputs the relay status signals from the data module and check module and if the status signals are not in agreement the EXCLUSIVE OR gate R15 generates a logic 1 output. This output is used to indicate that either the data module or check module is inoperative.

As described above, the check module CM initially functions to scan the operation of the respective data modules DM to determine the operational integrity of the data modules DM and in the event of an operational failure in one of the data modules, the check module CM terminates its scanning function and operationally replaces the defective data module to avoid loss of information from the remote assemblies RA associated with the defective data module DM. In its scanning mode of operation, the check module sequentially monitors the output information from the remote assemblies RA of the respective data modules such that the micro-computer circuit 26 and the micro-computer circuit 20 of the elected data module will simultaneously perform the identical computational processing of the input information. In the event of the computational results arrived at by the micro-computer circuits 20 and 26 are essentially identical, it is assumed that the selected data module DM is operating properly and the output of EXCLUSIVE OR gate RL6 is a logic 0. A significant variation in the computational results of the respective micro-computer circuits results in an EXCLUSIVE OR gate RL5 output being a logic 1 and indicates a probable operational defect in either the selected data module DM or the check module CM. If the computational results disagree, the results from both the check module CM and data module DM are transmitted via the multiplexer circuit M to the CRT display D. Also, the alarm level relay trip signal and the equipment failure signal developed by the micro-computer circuit 26 of the check module CM are supplied to the relay logic control circuit 14 of the selected data module DM via the operation of selector switch SS. The relay logic control circuit 14 interrogates equipment failure input signals from both the micro-computer circuit 20 of the selected data module and the micro-computer circuit 26 of the check module to determine which set of computational alarm levels are valid, as described above.

This method of using a check module CM to verify the operation of the data module DM will result in eventual detection of obvious failures as well as any of the following problems in either module:

(a) Error caused by noise or other signal interference;
(b) Subtle occasional parasitic or dynamic problems inherent in the circuit design, i.e. pattern sensitivities of the microprocessor;
(c) Undetected program errors.

These problems are usually very difficult to detect in computer systems. They are detected in the embodiment of FIG. 2 inasmuch as both the data module and the check module do not see the same history. Since response to current input data is heavily dependent on history, the same data to the two modules results in executing different program and data paths and will eventually result in different results. In case (a) above, noise that occasionally causes large errors in the data module inputs from the remote assembly RA will be detected when the check module CM monitors the data module DM while the noise has negligible effect on signals from the remote assembly RA. In this case, the history of noise seen by the data module DM but not seen by the check module CM will cause different results. In cases (b and c) above, the different data histories result in the data module and check module executing different program paths. Eventually, one module will execute the eroneous path while the other module will not; resulting in different calculated results.

The check module can also automatically replace a faulty data module for any error the equipment failure signal can detect via the multiplexer M and the relay logic control RLC. This scheme has the advantage that an inoperative check module cannot interfere with an operational data module, since an operational data module will not generate an equipment failure signal, thereby disabling the check module's responses. The computer timeout circuit C6 plays a major roll in detecting data module and check module failures. While the computer timeout circuit C6 discussed above can detect obvious errors such as the failure of the computer clock, it can further be used to detect much more subtle problems if the following conditions are met:

(1) The micro-computer circuit (20 and 26) conducts various well-known in-line tests and diagnostics to verify reasonability of data (i.e., determine that the calculated pulse rate is not negative) and the integrity of hardware (i.e., a data pattern read into read/write memory can be read back correctly).

(2) Program flow is measured by using entry/exit flags in key program modules or subroutines. As an example, an entry/exit flag can be a piece of data associated with the data or check module which can have two states: ON=0=flow not in module; OFF=1=flow in module. When the module is entered, the first step is to test the flag to ensure it is ON; then turn it OFF. When leaving the module, the last step is to test the flag is OFF; then turn it ON. Failure to pass an entry/exit flag test is indicative of incorrect program flow.

(3) A measurement of the computer state is made. The computer state at any time is defined by the contents of all registers, flags, and memory. The computer state measurement suggested here is to EXCLUSIVE OR the contents of several key registers whose contents is known immediately before the computer timeout circuit C6 is addressed. The EXCLUSIVE OR of these registers is presented as data to the computer timeout circuit C6. The reference R of the computer timeout circuit C6 is selected to be equal to the EXCLUSIVE OR result of the registers when the computer state is correct.

(4) Failure of any of the tests in (1) or (2) results in the computer halting.

Under these conditions, absence of an equipment failure indicates the following:

(1) all power supplies are operating;
(2) no obvious computer failures have occurred, such as a clock failure;
(3) computer operation appears to be reasonable;
(4) program flow is determined to be proper; and
(5) the measured computer state is correct. The combination of these five conditions results in a very high probability that the equipment failure signal EF will be activated if the data module fails.

Figure 6:
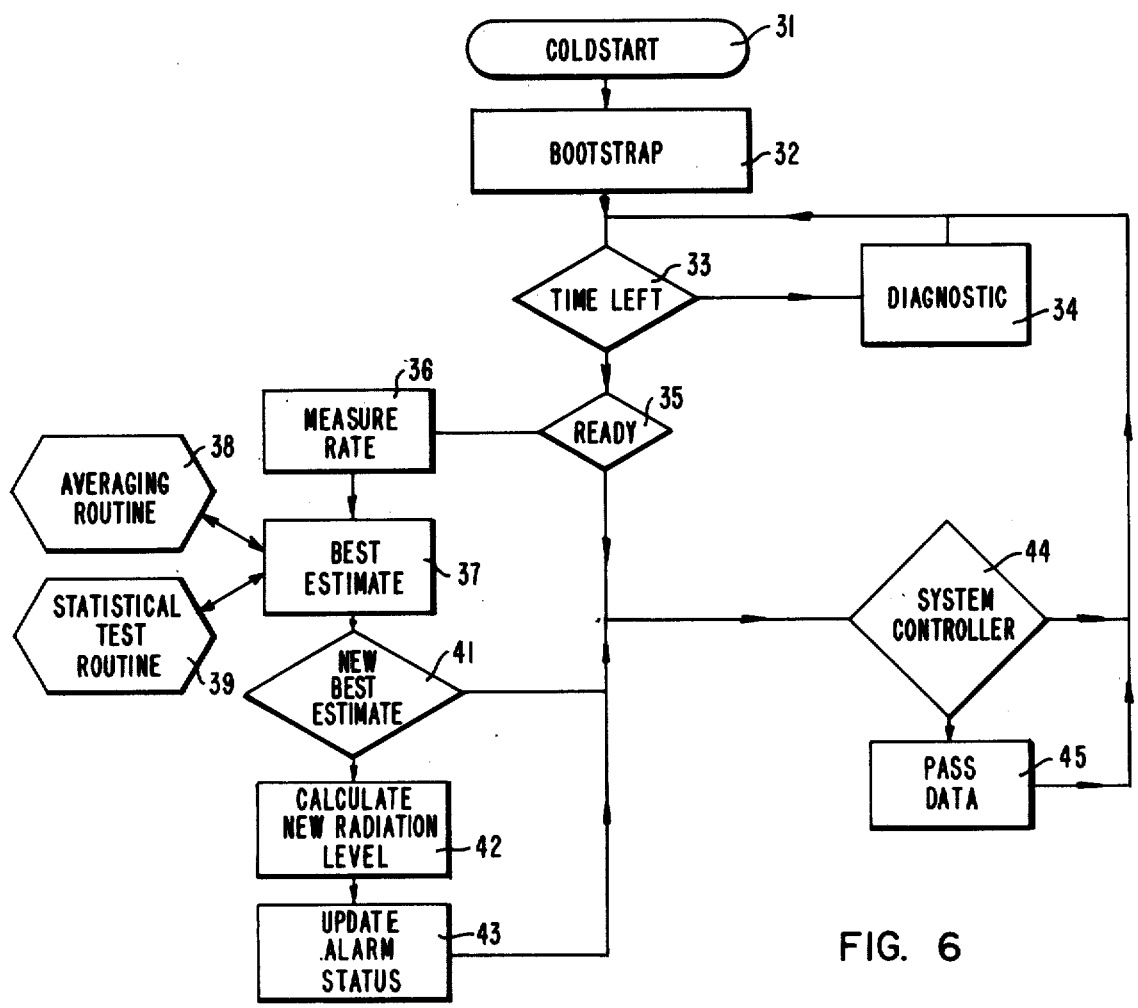
FIG. 6 is a flow chart illustration of the operation of the data module of FIG. 2.

Referring now to FIG. 6, there is illustrated in a program flow chart representation, the operation of a data module DM as controlled by the programming of the micro-computer circuit 20. Cold start 31 refers simply to the procedure of applying power to the circuitry, while boot-strap 32 refers to the procedure for setting or resetting initial circuit conditions as well as the variables stored in the read/write memory C5. The time remaining 33 and diagnostic 34 functions provide the capability of testing the operational status of the memory of the data module DM if adequate time is available. Ready 35 indicates that the micro-computer circuit 20 is in condition to accept information.

Assuming that it is time to estimate the rate of the pulses being transmitted from a monitor T in a remote assembly RA, the initial estimate is a function of the time required to count a predetermined number of events, i.e., 16. As an estimate of the true mean pulse rate, i.e., radiation level, the measure rate function 36 is subject to substantial errors due to statistical variations. Typical errors, which may be as high as ±50%, are unacceptable. Thus, the measure rate function 36 is further refined by the averaging routine 38 and the statistical test routine 39 to determine a best estimate of average rate 37. The best estimate of average rate 37 develops an output indicative of the true mean pulse rate generated by the monitor T with optimum trade-off between statistical error and response time.

The averaging routine 38 functions to average for very long periods of time in an effort to reduce the statistical error. The statistical test routine 39 functions to indicate whether the averaging time in the system should be extended to further reduce the statistical error or whether the true mean pulse rate has actually changed and it is more important to shorten the response time in the system at some sacrifice to the statistical accuracy. The combination of averaging routine 38 and statistical test routine 39 develops the best estimate 37 of the true mean pulse rate for optimum trade-off between system response time and statistical accuracy.

In the event new pulse rate information results in a new best estimate 41, a calculation of a new radiation level 42 corresponding to the new best estimate will occur. This typically is accomplished by subtracting the background radiation level and then multiplying by the channel gain. Update alarm status 43 is achieved by comparing the new radiation level to the predetermined alarm level and initiating changes in the status of the alarm relay as dictated by the new radiation level. The control functions, and particularly the keyboard K, operate via multiplexer circuit M (system controller function 44) to allow the operator to change channel gain, background or the predetermined alarm level. The most recent channel status is automatically transmitted via the multiplexer for display, etc. On completion of communications via the multiplexer circuit M, the program of FIG. 6 is returned to the program block time remaining 33. It is once again determined if adequate time is available to evaluate memory operations via the diagnostic function 34.

It is apparent from the above description of the functional operation of the circuitry of the data module DM that the most significant program functions are achieved by the best estimate of true mean rate function 37 as determined by the averaging routine 38 and the statistical test routine 39.

Figure 7A:
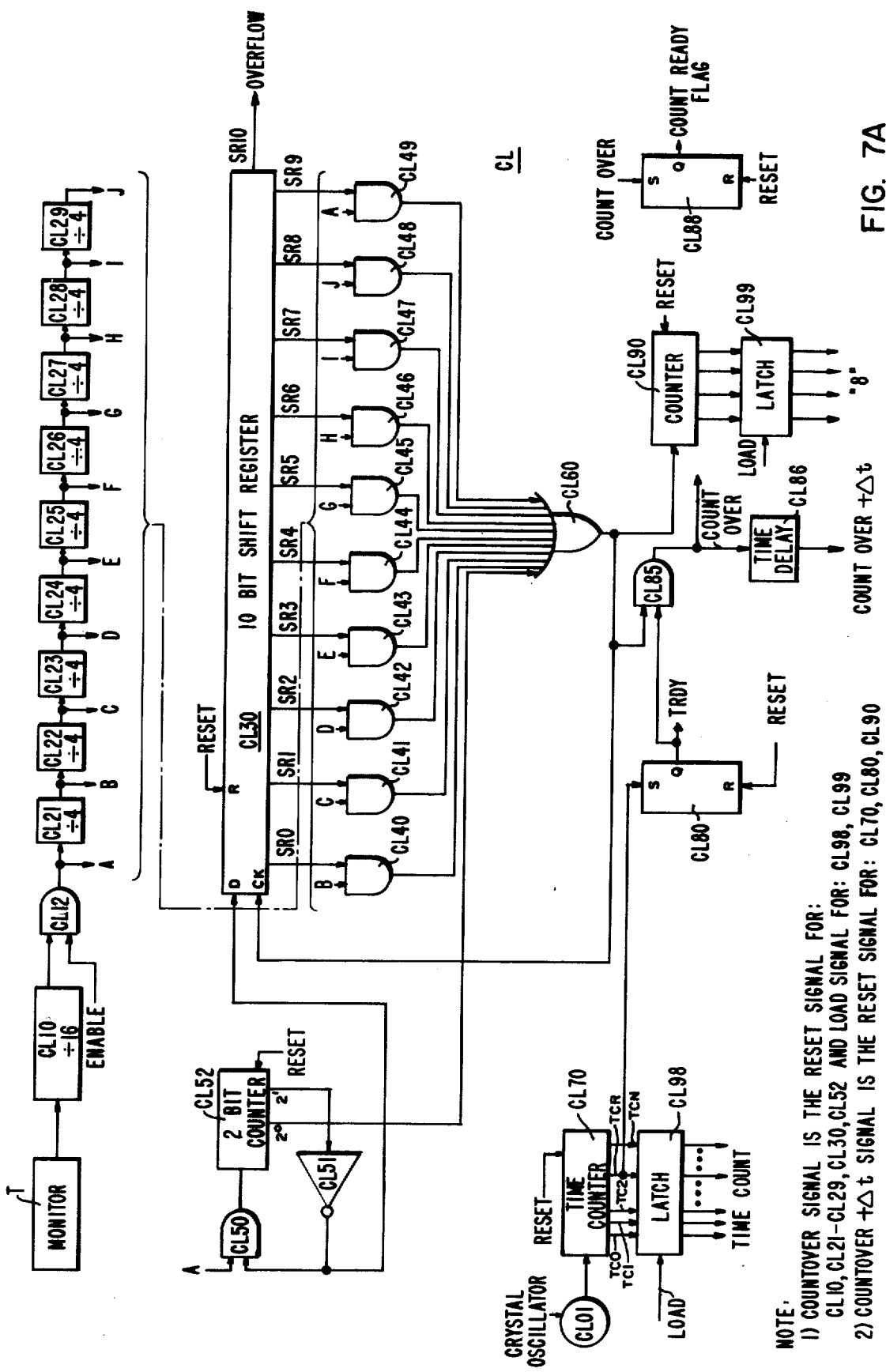
FIG. 7A is a hardware schematic implementation of the count logic of the remote assembly of FIG. 1.
Figure 7B:
FIG. 7B is a hardware representation of a portion of the program flow chart of FIG. 6 depicting the operation of the micro-computer circuit of FIG. 2.

The primary function of this program, as reflected in the equivalent hardware implementation of FIG. 7B, is to translate the pulse information transmitted from the monitors T of the remote assemblies RA into information corresponding to the true mean radiation level at the respective remote assemblies. The monitors T generate a pulse in response to an appropriate nuclear event. Therefore, the radiation level at the respective remote assemblies RA is proportional to the pulse rate generated by the monitors T. However, inasmuch as the instantaneous frequency of the pulses is random, the circuitry of data modules DM must measure the true mean pulse rate in order to determine the true average radiation levels. While it is well known that the true mean rate can be approximated by measuring the mean frequency of N events, this approximate measurement will not equal the true mean rate unless an infinite number of events or pulses is observed. The error introduced by measuring a finite number of events, i.e., pulses, is a function of the number of events, or pulses, measured and can be approximated by:

$$\epsilon = \pm \left[ k\, \sigma / \sqrt{N} \right] \times 100\%, \qquad (1)$$

where N=number of events observed and is greater than 15, $\sigma$=standard deviation and k=the constant employed to adjust the confidence level, i.e., 1.96 for a confidence level of 95%.

Furthermore, for a Poisson distribution the standard deviation ($\sigma$) can be approximated by the true mean rate. This relationship is true when N is large (>15) and the pulse rate is stationary. The above formula can be simplified by using the best estimate (BES) for the true mean rate to achieve:

$$\epsilon \approx \pm \left[ k(BES)/\sqrt{N} \right] \times 100\%. \qquad (2)$$

For example, to achieve an error of 10% with a confidence of 95%, an average of approximately 400 events must be processed. To reduce the error to 1% at a 95% confidence, the number of events averaged must be approximately $4 \times 10^4$. It is apparent therefore that a compromise in the system operation must be achieved to provide appropriate system accuracy and fast response time.

In principle, the program for the operation of the data module DM evolves primarily about the program functions 36, 37, 38 and 39 of FIG. 6. A typical hardware implementation of these program functions, which will serve as a basis for detail functional program discussion of these program functions, is schematically illustrated in FIG. 7B.

For the purposes of clarity, the discussion of the count logic circuit CL of the remote assembly RA as schematically illustrated in FIG. 7A has been combined with the discussion of the FIG. 7B schematic implementation of the program function of the micro-computer circuit 20 inasmuch as the count logic circuit CL is responsible for generating the essential pulse rate information for processing by the micro-computer circuits 20 and 26.

The count logic circuit CL of FIG. 7A represents a design which is operational over an extremely wide dynamic range and which functions to measure the time between an integer power of four events or pulses generated by the monitor T. The pulses from the monitor T are transmitted to a prescaler circuit CL10 which functions to generate an output pulse in response to each 16 events or pulses received from the monitor T. Inasmuch as each of the output pulses from the prescaler circuit CL10 accounts for 16 input pulses, the time measuring function of the circuit CL will be a measure of time between the occurrence of each block of 16 events or pulses. Inasmuch as 16 equals $4^2$, this represents an integer power of 4 events. An enable input signal to the AND gate CL12 in coincidence with an output pulse from the prescaler circuit CL10 will produce an output signal which is transmitted to the series arrangement of divide by 4 circuits CL21, CL22, CL23, CL24, CL25, CL26, CL27, CL28 and CL29. The divide by 4 circuits CL21-CL29 function as scalers with each developing an output pulse in response to each four input pulses received. Thus, if output A represents one pulse per $4^2$, or 16 events, then output B represents one pulse per $4^3$, or 64 events, output C represents one pulse per $4^4$, or 256 events, and so on. While the number of divide by 4 circuits illustrated, exhibits a highest output corresponding to $4^{10}$ events, the number of divide by 4 scalers employed is a matter of design choice.

A 10 bit shift register CL30 is employed having a data input D, a clock input CK, and 10 outputs, SR0-SR9, serving as inputs to AND gates CL40-CL49, respectively. Second logic inputs to the AND gates CL40-CL49 correspond to the divide by 4 scaler circuits CL21-CL29. The data input D of the 10 bit shift register CL30 receives logic input signals from an input circuit consisting of AND gate CL50, inverter gate CL51 and 2 bit counter CL52. The clock input CK to the 10 bit shift register CL30 corresponds to the output of the OR gate CL60 which has as its inputs the outputs of AND gates CL40-CL49 and the $2^0$ output of counter CL52. OR gate CL60 generates a logic 1 output in response to each integer power of N pulses transmitted from the monitor T.

The combination of the shift register CL30, AND gates 40-CL49, AND gate CL50, inverter CL51, counter CL52 and OR gate functions as a selector switch or stepping switch to transmit the information corresponding to the outputs of the scaler circuits CL21-CL29 to counter circuits to determine the integer power of N events.

The OR gate CL60 drives counter CL90. The count from counter CL90 is stored in latch circuit CL99 which generates the output "q" indicative of the number of events. Clock CL01 drives time counter CL70. The output of counter CL70 is stored in latch circuit CL98 which produces output "t" indicative of the elapsed time required to observe the events. Latch circuit CL80 is driven by the TCR, or $Z^R$ output, of time counter CL70, and provides the control signal "TRDY". Latch CL88 is driven by the control signal "count over" from AND gate CL85 and provides the output "count ready flag", which is used to synchronize the count logic with the circuit functions shown in FIG. 7B.

Assume initially that all the circuitry has been reset to logic 0 output states and the enable input of AND gate CK12 is a logic 1. After 16 pulses has been transmitted by the monitor T in response to 16 events, the "A" output of AND gate CL12 will be a logic 1 which is supplied as an input to AND gates CL49 and CL50. AND gate CL49 is disabled as a result of the logic 0 at the SR9 output of shift register CL30. However, AND gate CL50 is enabled as a result of a logic 1 output of the inverter gate CL51. The logic 1 output from the AND gate CL50 will cause counter CL52 to advance from a state 0 to a state 1 resulting a logic 1 at the $2^0$ output of counter CL52. The logic 1 at the $2^0$ output of the counter CL52 produces a logic 1 output from the OR gate CL60 which is applied as a logic 1 to the clock input CK of the shift register CL30. The D input of shift register CL30 is a logic 1 from the inverter CL51 as discussed above. This results in the shift register CL30 shifting a logic 1 from the D input to the output SR0. After an additional 16 events, the output of the AND gate CL12 will again be a logic 1 which will increment counter CL52 from state 1 to state 2. At this time, the $2^0$ output of the counter CL52 will go to a logic 0, thereby removing the logic 1 from the clock input CK of the shift register CL30 and the $2^1$ output of the counter CL52 will be a logic 1. This disables AND gate CL50 through inverter CL51 and blocks any further action until the bistable counter CL52 is reset. If further results in a logic 0 at the data input D of the shift register CL30 by maintaining a logic 1 at the $2^1$ output of the counter CL52. Thus, it is apparent, that the effect of the two bit counter circuit CL52 and the logic gates CL50, CL51 and CL60 is to load a single 1 into the shift register CL30, force logic 0's to be maintained for all other locations, and maintain the clock input CK in a ready condition for further use.

When the "B" output of divide by 4 scaler circuit CL21 is a logic 1, he shift register CL30 will have a logic 1 at the SR0 output. Thus, the "B" signal which is supplied as an input to the AND gate CL40 will be gated through AND gate CL40 to the OR gate CL60 resulting in a logic 1 output from the OR gate CL60. A logic 1 output of OR gate CL60 is again supplied to the clock input CK of the shift register CL30. This will result in the shift register CL30 shifting a 0 from the data input D to the SR0 output, a logic 1 from the SR0 output to the SR1 output, and logic 0's to all other outputs. AND gate CL40 will be disabled by the logic 0 at the SR0 output, thus preventing further action from the divide by 4 scaler circuit CL21 and establish a logic 0 at the clock input CK of the shift register CL30. The AND gate CL42 will be a logic 1, thus enabling the logic circuit CL42 for an output "C" from the divide by 4 scaler circuit CL22. Thus, further integer power of 4 events, or pulses, causes a single 1 in shift register CL30 to advance one position. The output of OR gate CL60 corresponds to a short pulse occurring each time an integer power of 4 events has occurred.

The output of OR gate CL60 is also available to counter CL90. Since counter CL90 increments one count every time an integer power of 4 events has been received, it represents the integer power of 4 of the present count. In the illustrated embodiment, the number of events that have been counted is $4^{(q+2)}$, where q is the output of the counter CL90, and the "2" is a result of the divide by 16 prescaler circuit CL10.

While this is occurring, the time counter CL70 is measuring a stable time reference, as can be obtained from the crystal oscillator CL0. After a fixed time, $t_r$, has elapsed, the time counter CL70 output, TCR, will be a logic 1 and will cause the output TRDY of the latch circuit CL80 to be a logic 1. This enables AND gate 85. The fixed time $t_r$ corresponds to a time which is adequate to satisfy the desired system accuracy and resolution of the time measurement. When the next integer power of four events is observed, the output of OR gate CL60, which is an input to the AND gate CL85, will result in a logic 1 output indicative of "count over". At this point in time, the time counter CL70 contains the elapsed time $4^{(q+2)}$ events to occur. The "count over" signal from the AND gate CL85 is used to reset counter CL52, reset dividers CL10 and CL21-CL29 and to load the contents "t" of the time counter CL70 into the latch circuit CL98, load the contents "q" of counter CL90 into latch circuit CL99, and set the latch circuit CL88 such that the "count ready flag" output signal is a logic 1. The "count ready flag" is available to indicate a new measurement. The reset signal "count over+$\Delta t$", as developed by time delay circuit CL86, is a delayed reset signal that allows the latches CL98 and CL99 to be loaded before the counters CL70 and CL90 are reset. Appropriate reset signals can be derived through the use of standard digital timing circuits (not shown). The "count over" signal satisfies the reset conditions for a new measurement. The addition of the AND gate CL49 to the SR9 output of the shift register CL30 provides a basis for developing an events overflow signal at output SR10 of the shift register CL30 if desired. After the last integer power of 4 events have been observed, the next counted event from gate CL12 will result in a logic 1 at the SR10 output of the shift register CL30 can be used to indicate an events overflow.

The time output information from latch circuit CL98 and the "q" output from latch circuit CL99 is employed to determine the average event rate for the $4^{(q+2)}$ events observed. However, the event and time inputs can be changed such that the circuitry functions to measure the number of events per integer power of 4 units of time by interchanging the locations of the events input and clock input. Further, the "q" output can be changed to represent the integer power of 2, 3, 5, etc. by changing the scaler circuits CL21-CL29; i.e., an integer power of 3 events can be measured by using divide by 3 scalers. The circuit can be further employed to approximate the log of a number of events. Note that the "q" output of the circuitry is a log base 4 of the number of events observed when an integer power of 4 events have been observed. By merely changing the scalers CL21-CL29, any base logarithm can be estimated. Since events can represent any quantity that can be measured by a number of pulses, any base logarithm of virtually any quantity can be estimated through the use of a circuit configuration similar to that of circuit CL. There are five parameters that must be considered for implementing this count logic circuit CL. The first parameter is the number of bits in the time counter CL70 before reaching position TCR, or in other words, the power of 2 that time counter position TCR represents. The second condition is the frequency of crystal oscillator CL01. The third condition is the total number of bits required for the time counter CL70 or, in other words, the power of 2 the time counter position TCN represents. The fourth condition is determining the number of prescalers or the number of shift register positions in shift register CL30. The final condition is the length of prescaler CL10. These conditions are determined as follows.

The first condition, the number of bits required before reaching time position TCR on the time counter CL70 is determined by the worst case accuracy requirements of the system. One of the limiting factors on the error of the measurement is that the time count will have a $\pm 1$ count ambiguity. This ambiguity should be such that lumped with all other errors the accuracy of the circuit meets the users needs.

The second condition, the crystal frequency, is determined in conjunction with the number of bits determined under condition 1 to ascertain the minimum count time. In most cases, the processing that is going to be done with the data will require some amount of time, for example, 60 milliseconds, and this will set the crystal oscillator frequency to get the maximum number of measurements, but to guarantee enough time between measurements so that the micro-computer circuit can process the data.

The third condition is determined by the minimum event rate from the monitor T and the length of prescaler CL10, or in other words, the minimum pulse rate at the output of AND gate CL12. At the minimum rate, and with the crystal oscillator frequency as determined above, the time counter CL70 must be long enough to guarantee that it does not overflow. In other words, the TCN output of counter CL70 must represent a large enough unit of time that it will not allow the time counter CL70 to overflow at the absolute minimum event rate.

The fourth condition, the number of prescalers required, or alternatively, the length of the shift register required of shift register CL30 is determined once the minimum count time is known. The number of prescalers and the length of the shift register must be such that at the maximum rate of pulses at the output of AND gate CL12, the shift register will not overflow, or in other words, the SR10 output of the shift register in this example must not become a logic 1 before the minimum count time period elapses.

The fifth variable is the length of prescaler CL10. The length of prescaler CL10 is determined as follows. The events or pulses coming from the monitor T are random. The only way to reduce the randomness of these events is to observe larger numbers of events. In the disclosed embodiment, observing 16 events guarantees that the statistical error of the true mean rate as measured will not vary from the actual true mean by more than approximately 50% of the measurement with 95% confidence. If the events were measured directly without a prescaler, the worst case error is considerably larger. The prescaler guarantees a minimum number of events observed below which statistical data cannot easily be obtained. The prescaler also helps insure the measurements have Poisson distribution, since the Poisson distribution is an approximation valid only if more than about 15 events are observed.

The "q" signal and the time signal "t" from the count logic CL are supplied as input signals to the program schematic PS of FIG. 7B. The "q" signal as applied to the adder circuit 60 and the multiplier circuit 61 develops a floating point number of events according to the formula:

$$N = 1.0 \times (4^{q+2})$$

$$N = 1.0 \times 2^{2(q+2)} \tag{3}$$

This resulting number of events and the time count information with a 0 exponent are presented to a floating point divider circuit 63. An acceptable floating point divider circuit 63 corresponds to divider circuitry employed in commercial calculators.

The result of the division operation of the floating point divider circuit 63 is the measured rate R corresponding to the operation of the program function 36 of FIG. 6. The averaging routine 38 is schematically represented by the divide by 4 circuits D1, D2, ... and D6, and the integrating registers IR1, IR2, ... and IR6.

The operation of the program illustrated in the flow chart of FIG. 6 and represented in part by the hardware schematic equivalent illustration of FIG. 7B is based on an initial assumption that the statistical distribution for the frequency of events represented by the pulse output from the monitor T can be approximated as a Poisson distribution. This assumption leads to the following representation as seen from equation (2):

$$\overline{R} = BES \left( 1 \pm \frac{k}{\sqrt{N}} \right) \tag{4}$$

where $\overline{R}$ is the true mean rate, k is the constant identified above and is typically assumed to be 2 to achieve the confidence level of approximately 95%, N is the number of events used in the estimate, and BES is the best estimate of the true mean rate. It is apparent that this error is a function solely of the estimate itself, BES, and the number of events used in obtaining this estimate. In the system described herein, the number of events N has been selected to be an integer power of 4, such that the square root of N is equal to a multiple of 4. If it is assumed that 16 events are always observed, the statistical error is equal to the best estimate times 2/4 where k is 2 and the square root of N is 4, or in other terms, the estimate times one-half, or ±50% of the estimate. As the number of events increases, the statistical error decreases.

Figure 8:
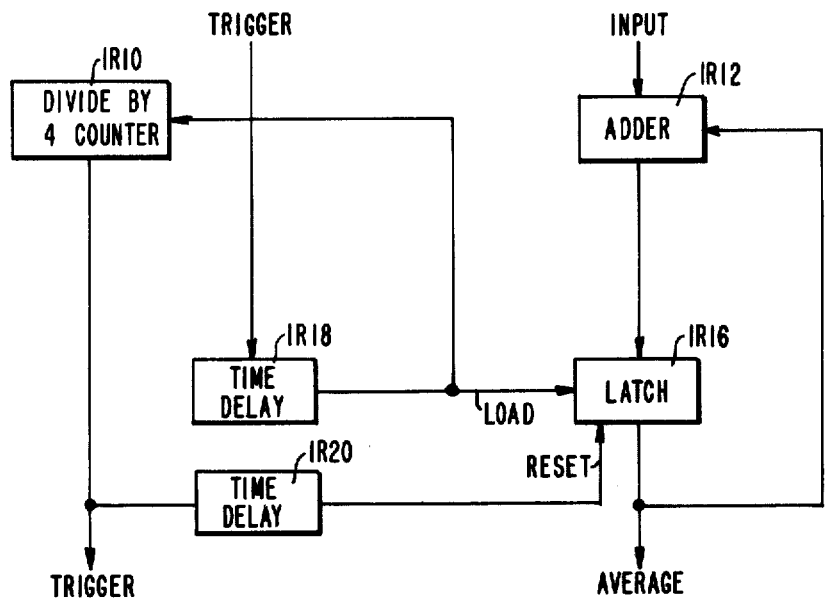
FIG. 8 is a schematic illustration of an integrating register of FIG. 7B.

The integrating registers IR1, IR2, ... IR6 determine the new estimate of the true mean rate based on the number of events monitored. The integrating register is similar to the summing memory of a calculator. The implementation of the integrating register is a matter of design choice. A typical implementation is shown in FIG. 8.

Initially, an estimate is determined by the best estimate circuit BE on the basis of 16 events, and this identified as a level 1 estimate corresponding to register IR1. A level 2 estimate corresponds to register IR2, ... and a level 6 to register IR6.

Initially, an estimate is developed on the basis of 16 events and this corresponds to the output of the circuit 63 which is divided by 4 by the divider circuit D1 with the result supplied as an input to the integrating register IR1. A subsequent output is divided by 4 and again inserted in the integrating register IR1. After four estimates have been developed based on observing four indications of 16 events, the integrating register IR1 is full and the contents represent an estimate based on 64 events. The full output of integrating register IR1 triggers a new best estimate that is divided by 4 by divider circuit D2 with results supplied as an input to the integrating register IR2. When integrating register IR2 is full, its contents represents an average based on the last 256 events. This rippling process continues down through integrating register IR6 which, when full, represents an average based on the last 65,536 events. The output of each integrating register is supplied to a best estimate circuit BE which selects the highest full integrating register as indicating the best estimate, i.e., the highest level integrating register which is full. A typical implementation of the best estimate circuit BE is schematically illustrated in FIG. 9.

For the purposes of the following discussion, it will be assumed that system response time is not important, and further that the true mean rate of events is stationary. Initially, the occurrence of the first 16 events produces a level 1 estimate which is transferred to the best estimate circuit BE and the variable level of the best estimate is said to be 1. The second measurement based on 16 is a new level estimate and this is used to update the best estimate circuit BE. Likewise, for the third and fourth measurements based on 16 events. After the fourth estimate based on 16 events, integrating register IR1 is full as it contains an estimate based on 64 events. This number is then transferred to the best estimate circuit BE and the level of the best estimate is now 2. At this point 64 events have been observed and integrating register IR2 has received its first input. Thus, the highest level integrating register, in the numerical sequence IR1–IR6 that is full, represents the best estimate. As the averaging continues for longer and longer periods of time, the statistical error of the best estimate becomes smaller and smaller until finally integrating register IR6 is full and the best estimate is based on the last 65,536 events which corresponds to the statistical error which is less than ±1%. The statistical error associated with the respective levels as calculated from equation (2) is illustrated in the tabulation of FIG. 7C.

Figures 7C, 9:
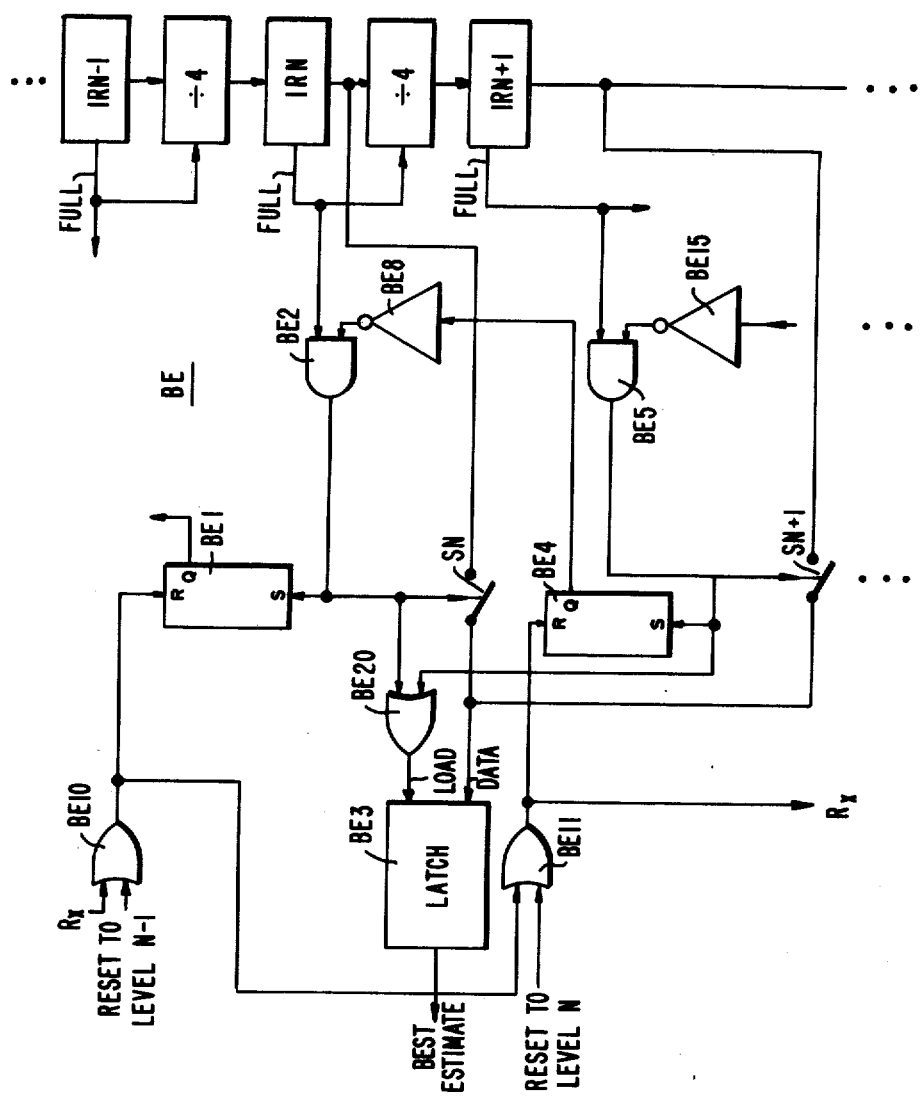
FIG. 7C is a tabulation of constants employed in FIG. 7B.
FIG. 9 is a schematic illustration of the best estimate circuit of FIG. 7B.

The statistical test routine 39 is developed recognizing that each of the integrating registers IR1, IR2, IR3, IR4, IR5 and IR6 has a different time constant, i.e., IR2 has a time constant of 64 events, IR2 has a time constant of 256 events, etc. and the selection of any one of the integrating registers as representing the best estimate results in the designation of a predetermined time constant and an estimated statistical error based on the tabulation of FIG. 7C. In the hardware implementation of the statistical test routine 39, the subtracting circuits (SC1, SC2, etc.) subtract the new estimated developed by the corresponding integrating register from the best estimate to produce an absolute value of the difference. A signal indicative of this difference is supplied as a first input to the comparator circuits (C1, C2, etc.) with the second input to the comparator circuit being a signal from the error estimate circuit (E1, E2, etc.) representative of the error estimate for the particular level. The error estimate is developed by multiplying the new estimate of the respective level by the corresponding error estimate reflected in FIG. 7C. For level 1, the error estimate corresponds to 0.5 times the new estimate of integrating register IR1. It is to be noted, that the error estimate signals are integer powers of 2 and therefore, if the mantissa of the numbers are represented in binary notation, the error estimate can be determined simply by shifting. This is comparable to multiplying or dividing by 10 for a decimal number by moving, or shifting, the decimal point. The comparator circuits (C1, C2, etc) compare the actual error corresponding to the signal developed by the subtracting circuits (SC1, SC2, etc.) to the estimated error generated by the error circuits (E1, E2, etc.) and if the expected error is larger than the actual error the comparator circuit develops a negative output signal. An actual error signal greater than the estimated error signal will produce a positive output from the comparator circuit.

The purpose of the statistical test routine, as described above, is to determine if the error of the respective integrating registers is less than the estimated error. As long as the actual error is less than the estimated error, the averaging routine will continue and the system time constant will eventually become long such that the statistical error of the measured error is less than 1%, with 95% confidence.

If the circuitry described above words without error and if the 95% confidence level is used in the statistical tests, it is reasonable to except that over a long period of time, each measurement would fail 5% of the time when the input is stationary. Since over 16,000 level zero estimates (i.e., estimates based on observing 16 events) must be made to generate one level 6 estimate, there is virtually no chance of generating a level 6 estimate before the level zero estimate fails the statistical test even if the input is stationary.

The breakout registers (BR1, BR2, etc.) resolve this problem by arranging the pass/fail data as described below.

The output of the comparator circuits (C1, C2, etc.) are supplied to the corresponding breakout registers (BR1, BR2, etc.), respectively. If a negative output is developed by a comparator circuit, the corresponding breakout register would increase in count value a predetermined number i.e., 14. A positive output signal from a comparator circuit will cause the corresponding breakout register to decrease by a predetermined count value, i.e., 1. When a breakout register exceeds a preset value it is said to overflow and it resets all the integrating registers of a higher level. For instance, if the breakout register BR1 of level 1 overflows, it will actuate a reset in the best estimate circuit BE to reset the integrating registers of the higher levels, i.e., IR2 through IR6. While the schematic illustration of FIG. 7B does not show the conventional circuitry necessary to achieve the reset function, such a function would be readily implemented as a matter of design choice. The overflow point for the breakout register can typically be less than 100. On the average, the actual error from the integrating register will be below the estimated error 95% of the time when the true mean rate of the events, or pulses, is stationary. If the suggested breakout register magnitudes, i.e., increase 14/decrement 1, are used, the ratio of increment/decrement equals the ratio of pass/fail test (95% pass and 5% fail). Thus the average value of the breakout register is zero when the pulse rate is stationary. If one of the breakout register exceeds the predetermined level, the pulse rate is assumed to be non-stationary and the reset of the integrating registers of the levels higher than the integrating register causing the overflow condition, will occur. The best estimate BES of the true mean rate is the contents of the highest integrating register that does not produce an overflow condition. This arrangement automatically gives a near optimal trade-off between accuracy and response time under all conditions. Each time an estimate is generated a statistical test is initiated.

Other breakout tests could be used. For example, a breakout could be initiated if two out of three statistical tests fail. However, the test described above uses the average weighted value of the pass/fail attempts as described earlier. Obviously, the parameters of the breakout test as well as the type of breakout test affects the sensitivity of the statistical routine to changes in the mean radiation levels as well as the tendency to breakout with a stationary input. These parameters must be set for the individual application using statistical mathematics to analyze the effects of these parameters.

There is disclosed below with reference to FIGS. 8, 9 and 10 typical schematic implementations of the integrating register, best estimate circuit and breakout register respectively. The integrating register of FIG. 8 includes divide by 4 counter circuit IR10, adder circuit IR12, a latch circuit IR16, a time delay circuit IR18 and a time delay circuit IR20. A full signal from a preceding integrating register is applied to the trigger input. The data of the previous integrating register is presented as the signal input to adder IR12. The data is added to the contents of the latch circuit IR16 through adder IR12. When the previous integrating register is full, the trigger signal is a logic 1 and after a time delay established by time delay IR18 the latch load input is activated to cause the content of the adder circuit IR12 to load the sum of the new input into the latch circuit IR16 as well as incrementing the divide by 4 counter circuit IR10. If this is the fourth input summed, as indicated by the count in the divide by 4 counter circuit IR10, the divide by 4 counter circuit overflows to trigger the next integrating register and to activate the time delay circuit IR20 which functions to reset the latch circuit IR16 after a fixed time delay.

The discussion of the best estimate circuit BE of FIG. 9 incorporates the operation of integrating registers comparable to those disclosed above.

Initially, it is assumed that latch BE1 and latch BE4 both have logic 0 outputs. Under these conditions, inverter BE8 will present a logic 1 to AND gate BE2 and AND gate BE2 is considered enabled. When integrating register IRN is filled for the first time, the "full" output signal is a logic 1 which is supplied to the AND gate BE2. The resulting logic 1 output from AND gate BE2 closes switch N, sets the latch BE1, thereby changing the output of BE1 to a logic 1. The logic 1 output of AND gate BE2 is further gated through OR gate BE20 to the load input of latch BE3. The data contained in the integrating register IRN will then travel through switch SN and be loaded in the best estimate latch BE3. Latch BE3 then contains the best estimate which is the data from integrating register IRN. This operation repeats the first four times register IRN is full. When IRN+1 fills for the first time, it goes through a similar operation, namely the IRN+1 full signal activates AND gate BE5, since a logic 1 output is provided by the inverter BE15. This results in a logic 1 at the output of AND gate BE5 which sets latch BE4 and closes switch $S_{N+1}$. The data from register IRN+1 is then presented to the input of the best estimate latch BE3, and the best estimate latch load command travels from the output of AND gate BE5 through OR gate BE20 and to the load input of the best estimate latch. The result of these conditions loads the data of register IRN+1 into the best estimate latch BE3. The best estimate is now the contents of integrating register IRN+1. The first time the integrating register IRN+1 is full latch BE4 is set and its output goes to a logic 1. The logic 1 is inverted by inverter BE8 to be a logic 0 at the input of AND gate BE2 and AND gate BE2 is disabled. Thus once integrating register IRN+1 has loaded its data into the best estimate latch BE3, integrating register IRN can no longer load its data into the best estimate latch BE3. Thus, while the true mean rate is determined to be stationary, the best estimate signal BES will be the contents of the highest full integrating register. If at any time the pulse information is determined to be non-stationary, one of the breakout registers (BR1, BR2, etc.) will put out a signal to reset part or all of the integrating registers and to re-establish the best estimate of the true mean rate. This is achieved as follows.

Assume that the statistical test fails at a level N-1 which precedes level N. Under this condition a reset to level N-1 signal is presented to OR gate BE10. The output of OR gate BE10 will reset latch BE1 producing a logic 0 output from latch circuit BE1 which would be supplied through an inverter gate of the preceding logic circuit of level N-1 to enable the AND gate corresponding to AND gate BE2 of level N. The output of OR gate BE10 is an input to OR gate BE11. The output of OR gate BE11 resets latch BE4. The output of latch BE4 goes to a logic 0, which is inverted by inverter BE8 to present a logic 1 at the input of AND gate BE2. This allows integrating register IRN, the next time it is filled, to present its data into the best estimate latch BE3. The output of OR gate BE11 will similarly reset succeeding stages of logic circuits associated with integrating registers at higher levels. Assume that the breakout test fails at level N. In this case the reset to level N signal supplied to OR gate BE11 will be a logic 1. OR gate BE11 will reset latch BE4, which in turn enables AND gate BE2. OR gate BE11 will also reset the logic circuits of higher levels. However, latch BE1 is not reset under these conditions, which means that integrating register IRN-1 will not be able to present its data at the input to the best estimate latch BE3. Thus the circuit of FIG. 10 allows the statisticl test to reset integrating registers above the level where the test failed, but not to reset integrating registers below the level where the test failed, where lower levels indicate shorter time constants and higher levels indicate longer time constants.

Figure 10:
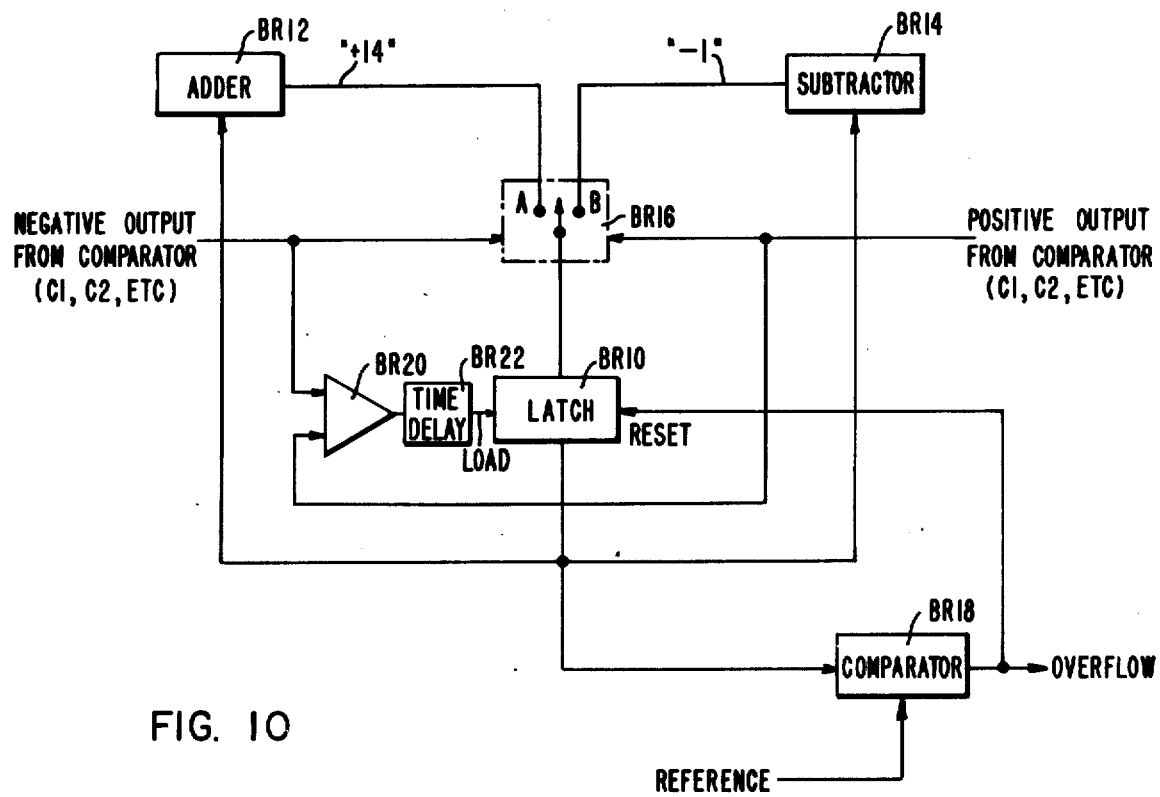
FIG. 10 is a schematic illustration of the breakout register of FIG. 7B.

The simplified implementation of the breakout register as illustrated in FIG. 10 consists of a switch circuit BR16 which responds to a negative output indication from the comparators C1, C2, etc. by introducing a positive preset count value, i.e., 14, from adder BR12 to the latch circuit BR10 and responding to a positive output from the comparators C1, C2, etc. by introducing a negative preset count value, i.e., −1, from subtractor BR14 to the latch circuit BR10.

The outputs from the comparator circuits C1, C2, etc. also are applied through OR gate BR20, time delay BR22 to load the count value into the latch circuit BR10.

The count value of latch circuit is supplied to a comparator circuit BR18 where it is compared to a reference indicative of overflow conditions. If the count value of the latch circuit BR10 exceeds the reference the overflow output of the breakout register is generated. This overflow output also functions to reset the latch circuit BR10.

We claim:

1. An information monitoring system, comprising:
    a plurality of first information processor circuit means, each adapted to receive input information corresponding to at least one parameter and generate a measurement output signal indicative of a measurement of said parameter;
    a second information processor circuit means,
    selector circuit means for sequentially connecting input information of each of said first processor circuit means to said second information processor circuit means, said second information processor circuit means duplicating the operation of the respective first processor circuit means and generating a measurement output signal, and
    circuit means for processing the measurement output signals from the second information processor circuit means and the respective first information processor circuit means to provide an indication of the operational integrity of said first and second information processor circuit means.

2. An information monitoring system as claimed in claim 1 further including failure logic circuit means associated with each of said first information processor circuit means and said second information processor circuit means to generate an operational status output signal indicative of the operational integrity of the respective processor circuit means;
    said circuit means for processing including an circuit means adapted to interrogate the operational status output signal corresponding to the first processor circuit means and the operational status signal corresponding to the second processor circuit means to terminate the operation of the selector circuit means and operationally substitute the second information processor circuit means for a first information processor circuit means in the event the operational status output signal from the failure logic circuit means indicates a faulty operational status of the first processor circuit means.

3. An information monitoring system as claimed in claim 2 wherein each of said first information processor circuit means and said second information processor circuit means generates a control output signal indicative of a predetermined relationship between the input information and a predetermined reference, and
    control initiating circuit means responsive to said control output signal,
    said interrogating circuit means for interrogating the operational status output signals transmitting the control output signal from said second information processor circuit means to said control initiating circuit means in place of said control output signal of said first information processor circuit means when an operational status output signal indicates faulty operational status of the first processor means.

4. An information monitoring system as claimed in claim 3 wherein each of said first information processor circuit means and said second information processor circuit means includes a microcomputer circuit having a memory, and a buffer circuit coupling said input information to said microcomputer circuit to render the input information compatible with said microcomputer circuit, said microcomputer circuit generating said measurement output signal and control output signal.

5. An information monitoring system as claimed in claim 4 further including an operator controlled microcomputer entry circuit operatively connected to said micro-computer circuit to provide access to the memory of said microcomputer circuit to provide operator input to change said predetermined reference.

6. An information monitoring system as claimed in claim 5 wherein said parameter is radiation level, and said input information corresponds to pulse rate information indicative of a radiation level, said predetermined reference corresponding to a predetermined radiation level.

7. An information monitoring system as claimed in claim 1 wherein the parameter monitored by each of said first information processor circuit means is identical, and the operation of each of said first information processor circuit means is identical.

8. An information monitoring system as claimed in claim 1 further including output circuit means for manifesting said measurement output signals.

9. An information monitoring system as claimed in claim 2 wherein said interrogating circuit means provides a fail-safe output signal to said control initiating circuit means if operational status of both a first information processor circuit means and the second information processor circuit means indicate faulty operational status.

10. An information monitoring system as claimed in claim 1 wherein said circuit means for processing compares the measurement output signal of said first information processor circuit means and the measurement output signal of said second information processor circuit means and generates an output signal in response to a predetermined relationship between said measurement output signals.

* * * * *